United States Patent [19]

Devera et al.

[11] Patent Number: 4,937,934
[45] Date of Patent: Jul. 3, 1990

[54] INSTALLATION OF SURFACE MOUNT COMPONENTS ON PRINTED WIRING BOARDS

[75] Inventors: Michael J. Devera, Cedar Rapids; Rick A. Williams, Iowa City; Jerome P. Mulka, Marion, all of Iowa

[73] Assignee: Rockwell International Corporation, El Segundo, Calif.

[21] Appl. No.: 309,457

[22] Filed: Feb. 10, 1989

[51] Int. Cl.$^5$ .............................................. H05K 3/34
[52] U.S. Cl. ........................................ 29/840; 29/847; 228/180.2
[58] Field of Search ................ 29/890, 897; 427/96; 228/180.1, 180.2

[56] References Cited

U.S. PATENT DOCUMENTS

| | | | |
|---|---|---|---|
| 3,778,530 | 12/1973 | Reimann | 228/180.2 X |
| 3,887,760 | 6/1975 | Krieger et al. | 228/180.2 X |
| 4,591,659 | 5/1986 | Leibowitz | 427/96 X |
| 4,617,729 | 10/1986 | Celnik | 29/840 |
| 4,638,938 | 1/1987 | Yarne et al. | 228/180.2 X |
| 4,806,200 | 2/1989 | Larson et al. | 29/847 X |

FOREIGN PATENT DOCUMENTS 63-302595  12/1988  Japan ................. 228/180.1

Primary Examiner—Carl J. Arbes
Attorney, Agent, or Firm—M. Lee Murrah; V. Lawrence Sewell; R. Fredrick Hamann

[57] ABSTRACT

Movement of surface mount components during soldering onto TEFLON TM printed wiring boards is prevented by applying a strip of solder mask material to a solder pad to define a component lead area and applying solder to areas of the areas of the solder pad not covered by the solder mask strip. Solder paste is applied to the component bad area and the surface mount component is positioned with a lead in registry with the component lead area. The entire board is then heated to mechanically and electrically adhere the component lead to the pad.

7 Claims, 1 Drawing Sheet

U.S. Patent    Jul. 3, 1990    4,937,934
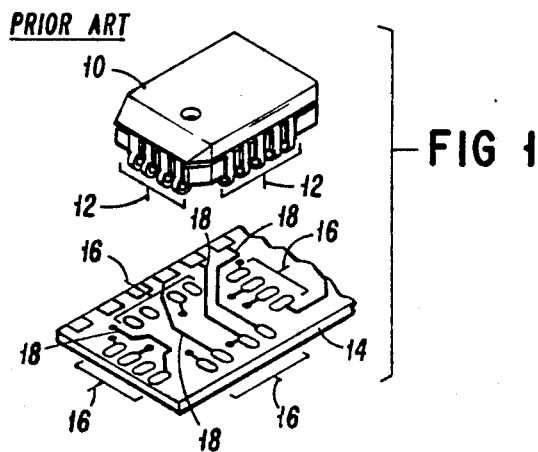
FIG 1 — PRIOR ART
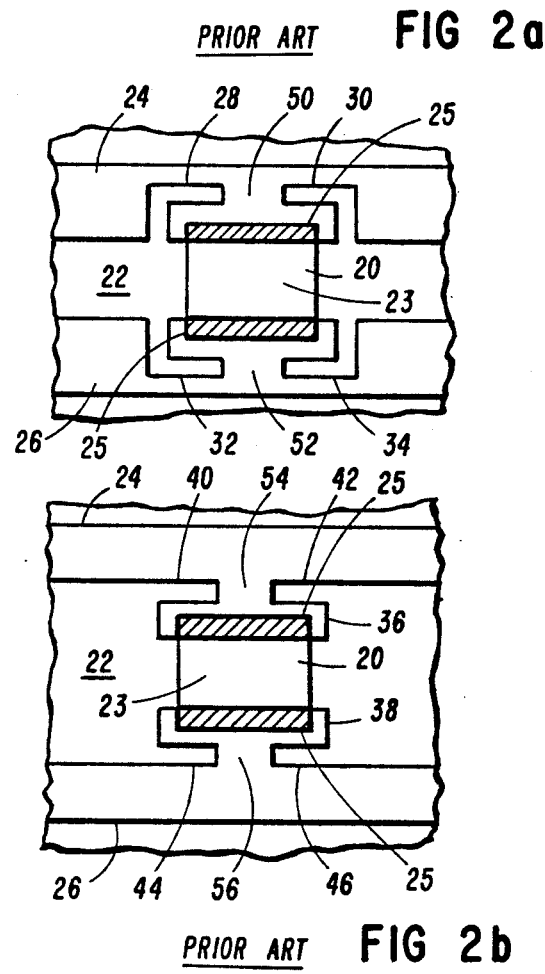
FIG 2a — PRIOR ART
FIG 2b — PRIOR ART
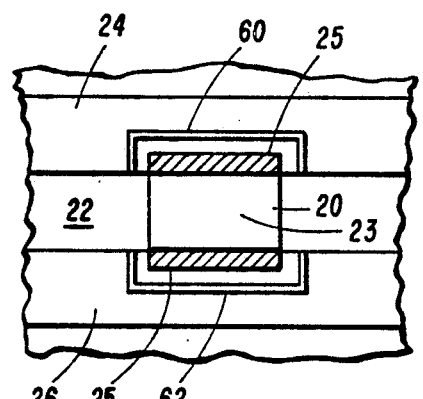
FIG 3
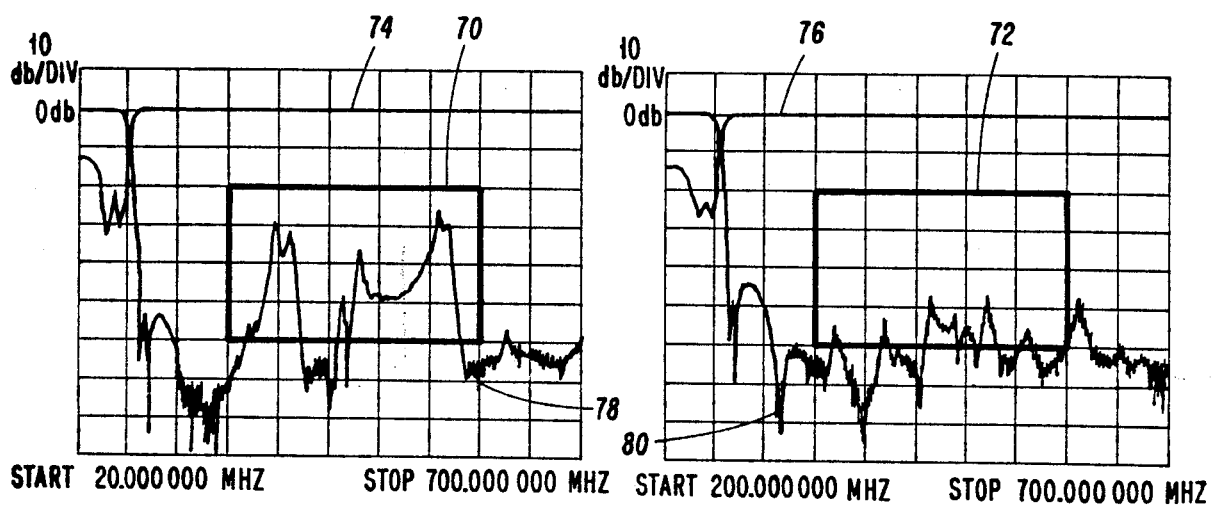
FIG 4a    FIG 4b

INSTALLATION OF SURFACE MOUNT COMPONENTS ON PRINTED WIRING BOARDS

This invention was made with Government support under Contract No. N00019-84-C-0128 Modification P00003 awarded by the Department of the Navy, Naval Air Systems Command, Washington, D.C. The Government has certain rights in this invention.

BACKGROUND OF THE INVENTION

The invention relates to new and useful improvements in the manufacturing of printed wiring boards, and more particularly to installation of surface mount components on printed wiring boards, and most particularly to soldering such surface mount components on to printed wiring boards.

Surface mounting of electronic components on printed wiring boards has become the prevalent mounting method for boards used in high quality, high density electronic equipment. This method not only improves the reliability and performance of such boards but also increases the efficiency of the manufacturing process. Surface mount technology is explained in an article in *OST* magazine, October, 1987, on page 15 et seq., which is incorporated herein by reference.

In the present practice, surface mount components are often soldered to printed wiring boards using the vapor phase technique. In this technique a solder paste is applied to the printed wiring board pads and, a component is positioned and held in place atop the pads by the paste. The board is then passed through or placed in a chamber containing the vapor of a liquid which has a boiling temperature higher than the melting temperature of the solder. The solder is thus melted, and the printed wiring board is then passed or placed into a cooling chamber where the solder hardens into its final state.

The vapor phase soldering process can result in unwanted component shifting due to solder movement. This shifting in component position can result in defective assemblies which must be repaired by costly manual methods, and it increases tuning time of component placement sensitive designs. Shifting can be minimized by containment of solder in the immediate pad termination area. Containment of solder thus results in printed wiring board assemblies approaching the production goals of zero defect soldering and minimized electrical adjustment time.

The present approaches to solder containment vary depending upon the board material. On polymide and glass boards, solder containment involves minimization of the size of the pad termination area and the width of the signal lines attached to the pads. In addition, solder mask material may also be applied over large areas of the component side of the printed wiring board and circuit traces primarily to prevent electrical shorting of circuit traces from conductor to conductor or component to component. On TEFLON TM boards, however, these approaches may have limited usefulness for several reasons. First, radio frequency printed wiring boards for use in the VHF/UHF ranges typically have circuit line widths larger than at lower signal frequencies in order to maintain the required characteristic impedance. Second, the solder mask material is typically not applied to bare TEFLON TM itself, and other board materials having similar characteristics, since its adhesion to the TEFLON TM material is poor and would tend to flake off. Finally, any solder mask material bridging RF circuit traces would effectively increase the dielectric constant of the TEFLON TM board material resulting in more electrical losses and degraded frequency range.

The generally accepted practice for solder containment in TEFLON TM designs is to fabricate a "neck", into the circuit trace on the printed wiring board. However, the circuit trace necking approach results in degraded electrical performance due to the unwanted parasitic effects created by induced resistance, inductance and capacitance. In addition, the circuit trace necking approach does not entirely eliminate the component shift problem.

The approach of the present invention involves application of a solder mask over bare copper. Solder mask is commonly placed on the bottom side of a printed wiring board to prevent solder bridging during wave soldering. However, there are no known uses of a solder mask on the top side of a TEFLON TM printed wiring board for the purpose of preventing solder movement to ensure proper placement of surface mount components.

It is, therefore, an object of the present invention to improve the soldering of surface mount components to printed wiring boards such that the goal of zero defects is more nearly attained.

It is further an object of the present invention to eliminate the shifting of surface mount components in the vapor phase soldering process.

It is yet another obJect of the present invention to decrease the cost of manufacturing printed wiring board assemblies containing surface mount components.

It is still another object of the present invention to decrease the cost of testing printed wiring board assemblies containing tunable or placement sensitive surface mount components.

SUMMARY OF THE INVENTION

A substantial reduction in defects in soldering surface mount components to printed wiring board substantial improvement in frequency performance of the resulting boards, and substantial improvements in achieving repeatable electrical characteristics is obtained by surrounding the surface mount component with a solder mask adhering directly to bare copper solder pads. The solder mask adheres to the bare copper throughout the vapor soldering process and prevents movement of the solder onto adjacent areas, thereby preventing movement of the surface mount component. The elimination of circuit trace necking of the prior art eliminates areas on the solder pads which limit frequency response of the circuit.

BRIEF DESCRIPTION OF THE DRAWINGS

The invention may be more fully understood by reading the following description of a preferred embodiment of the invention in conjunction with the appended drawings wherein:

FIG. 1 is an exploded, perspective view of a surface mount device and a portion of a printed wiring board containing solder pads for the receiving leads of the surface mount device as practiced in the prior art;

FIG. 2a and 2b are plan views of a portion of an RF printed wiring board with a mounted component showing two prior art methods of using circuit trace necking to prevent the shifting of surface mount components;

FIG. 3 is a plan view of a portion of an RF printed wiring board with a mounted component, using solder mask over bare copper over TEFLON ™ of the present invention; and FIG. 4a and 4b are frequency response graphs showing the electrical performance of a low pass filter with and without the circuit trace necking of the prior art.

DESCRIPTION OF THE PREFERRED EMBODIMENT

Referring first to FIG. 1, a typical surface mount component 10 having a multiplicity of signal leads 12 on the underside periphery thereof is shown. Also shown is a typical printed wiring board 14 having a plurality of solder pads 16 to receive leads 12 of surface mount component 10 and a multiplicity of conductor traces 18 connecting pads 16 to other components of the circuit. While small isolated solder pads 16 are shown for purposes of illustrating the general surface mount method, it should be understood that solder pads also include any conductive area on a printed wiring board to which surface mount component leads may be soldered.

Referring next to FIGS. 2a and 2b, typical circuit trace necking configurations of the prior art are shown. In FIGS. 2a and 2b a surface mount component 20 is shown mounted on a printed wiring board 22 and soldered to an RF transmission line comprising adjacent tin lead coated copper conductors 24 and 26. FIGS. 2a and 2b illustrate a radio frequency (RF) application in which component 20 is a capacitor having a dielectric center 23 and metal leads 25. Copper conductors 24 and 26, while different from the solder pads illustrated in FIG. 1, are within the meaning of solder pads as used herein. In FIG. 2a a circuit trace neck comprised of L-shaped legs 28, 30, 32 and 34 is formed around component 20 in transmission line conductors 24 and 26 by removal of copper material. In FIG. 2b portions 36 and 38 of conductors 24 and 26 respectively extend inwardly therefrom. A circuit trace neck is formed around surface mount component 20 on legs 40 and 42 found in conductor portion 36 and legs 44 and 46 formed in conductor portion 38, legs 40, 42, 44 and 46 being formed by removal of copper trace material. The arrangements of FIGS. 2a and 2b create unwanted parasitic effects due to resistance, inductance and capacitance in areas 50, 52, 54, and 56, which limit the frequency response of the circuit, which is more noticeable in RF applications.

Referring to FIG. 3, the method of the present invention is shown. As in FIGS. 2a and 2b, a surface mount component 20 is soldered to adjacent tin lead coated copper conductors 24 and 26 adhering to a board made of tetrafluoroethylene, which is commonly known by its trademark TEFLON ™. While TEFLON ™ is used in the preferred embodiment, the method of the present invention may be applied in RF applications to other materials having a low dielectric constant. As in FIGS. 2a and 2b, the component is a capacitor as previously described. However, instead of a circuit trace neck, surface mount component 20 is surrounded by a thin strip of solder mask material comprising C-shaped portion 60 adhering to a small portion of bare copper conductor 24 and C-shaped portion 62 adhering to a small portion of bare copper conductor 26. In other words, tin lead solder is deposited on all area of upper conductor 25, for example, except the area to be covered by solder mask 60. Then solder mask is applied directly to the base copper in the area from which the tin lead solder is omitted.

The method of the present invention is referred to as SMOBCOT (Solder Mask Over Bare Copper Over TEFLON ™. The SMOBCOT approach eliminates circuit trace necks in the etch and allows the use of undisturbed transmission line. The application of the solder mask over the bare copper prevents solder movement and thus component shifting. The key to the SMOBCOT approach is judicious placement of the solder mask material over bare copper only, which serves several purposes. First, the solder mask material would tend to float if it were deposited over the tin/lead solder. Application of the solder mask material to bare copper eliminates floating. Second, solder mask cannot be deposited over TEFLON ™ itself since adhesion between the materials is very poor and the solder mask thus tends to flake off. Third, any solder mask material bridging RF traces would effectively increase the dielectric constant of the printed wiring board material, which results in increased electrical losses and degraded circuit performance. Lastly, the judicious application of narrow widths of solder mask material to the bare copper in the immediate pad termination area of the component may, for the most part, be omitted from any transmission line calculations in RF circuit application.

The SMOBCOT approach is very cost effective. There is a cost increase of about 10% in board manufacturing since the application of solder mask material to the bare copper requires an additional processing step. The method also requires additional engineering support since additional time is required for the board layout. However, the savings resulting from reduced manufacturing defects, a improved performance and more repeatable designs more than compensate for the increased direct board costs.

The SMOBCOT method has been successfully demonstrated on several low pass filter designs in the VHF/UHF frequency range. FIGS. 4a and 4b demonstrate the performance of a low pass filter with circuit trace necks, as compared to the performance of the same low pass filter using the SMOBCOT method (i.e., no circuit trace necking). As shown by comparison of boxed area 70 in FIG. 4a to boxed area 72 in FIG. 4b, the stop band performance is improved by approximately 20 db using the SMOBCOT method. The return loss is shown by trace 74 in FIG. 4a and by trace 76 in FIG. 4b. The insertion loss is shown by traces 78 and 80 in the same figures, respectively. The judicious application of the solder mask has been shown thus far to work effectively up to frequencies of 400 MHz with no increase in transmission line insertion losses. Stopband performance improvements have been noted at frequencies up to 1 GHz. The upper frequency limit of the usefulness of the SMOBCOT method has not yet been determined but is believed to be in the 2 to 3 GHz range.

While particular embodiments of the present invention have been shown and described, it is obvious that minor changes and modifications may be made therein without departing from the true scope and spirit of the invention. It is the intention in the appended claims to cover all such changes and modifications.

We claim:

1. Method of soldering a surface mount component having at least one signal lead thereon to a copper-clad printed wiring board, comprising the steps of:
   removing copper from the printed wiring board to form at least one copper solder pad in the area where placement of the surface mount component is desired;

forming a solder mask and adhering the solder mask material to the copper solder pad adjacent to at least a portion of the periphery of the desired placement area;

applying solder to said copper pad adjacent said solder mask;

applying solder paste to said solder pad in the desired component placement area;

positioning said component with a signal lead in registry with said component placement area of solder pad; and heating said printed wiring board and component to melt the solder paste to electrically and mechanically bond the component signal lead to said solder pad.

2. Method of soldering a surface mount component having at least one signal lead thereon to a copper-clad printed wiring board as described in claim 1 wherein the board substrate is comprised of tetrafluoroethylene.

3. Method of soldering a surface mount component having at least one signal lead thereon to a copper-clad tetrafluoroethylene printed wiring board having at least one copper solder pad thereon in the area where placement of the surface mount component is desired, comprising the steps of:

forming a solder mask and adhering the solder mask material to the copper solder pad adjacent to at least a portion of the periphery of the desired placement area;

applying solder paste to said solder pad;

positioning said component with a signal lead in registry with said solder pad; and heating said printed wiring board and component to melt the solder paste to electrically and mechanically bond the component signal lead to said solder pad.

4. Method of manufacturing an RF circuit with a surface mount component having at least first and second signal leads thereon, on a copper-clad printed wiring board, comprising the steps of:

removing copper from the printed wiring board to form a first copper conductor;

removing copper from said printed wiring board to form a second copper conductor adjacent to the first copper conductor;

forming a first solder mask on said first copper conductor to enclose a first component lead area on the inner periphery of said first copper conductor;

forming a second solder mask on said second copper conductor adjacent to said first copper conductor to enclose a second component lead area on the inner periphery of said second copper conductor;

applying solder to said first and second copper conductors adjacent said solder mask;

applying solder paste to said first and second component lead areas;

positioning said component with a first signal lead in registry with said first component lead area and said second signal lead in registry with said second component lead area; and heating said printed wiring board and component to melt the solder paste to electrically and mechanically bond the component signal lead to said solder pad.

5. Method of manufacturing an RF circuit with a surface mount component having at least first and second signal leads thereon, on a copper-clad printed wiring board as described in claim 4 wherein said board is comprised of tetrafluoroethylene.

6. Method of manufacturing an RF circuit with a surface mount component having at least first and second signal leads thereon, on a copper-clad printed wiring board, as defined in claim 5 wherein said first and second conductors are formed adjacent to each other to perform as an RF transmission line.

7. Method of manufacturing an RF circuit with a surface mount component having at least first and second signal leads thereon, on a copper-clad tetrafluoroethylene printed wiring board having first and second adjacent copper conductors formed thereof, comprising the steps of:

forming a first solder mask on said first copper conductor to enclose a first component lead area on the inner periphery of said first copper conductor;

forming a second solder mask on said second copper conductor adJacent to said first copper conductor to enclose a second component lead area on the inner periphery of said second copper conductor;

applying solder to said first and second copper conductors adjacent said first and second solder masks;

applying solder paste to said first and second solder pad areas;

positioning said component with a first signal lead in registry with said first solder pad area and said second signal lead in registry with said second solder pad area; and heating said printed wiring board and component to melt the solder paste to electrically and mechanically bond the component signal lead to said solder pad.

* * * * *